United States Patent [19]

Vranken

[11] 4,313,152

[45] Jan. 26, 1982

[54] FLAT ELECTRIC COIL

[75] Inventor: Roger A. Vranken, Eindhoven, Netherlands

[73] Assignee: U.S. Philips Corporation, New York, N.Y.

[21] Appl. No.: 110,283

[22] Filed: Jan. 7, 1980

[30] Foreign Application Priority Data

Jan. 12, 1979 [NL] Netherlands ........................ 7900244

[51] Int. Cl.[3] .......................... H05K 1/16; H01F 5/00

[52] U.S. Cl. .................................... 361/402; 336/200; 336/232

[58] Field of Search ................. 336/223, 200, 232, 69, 336/70; 361/268, 270, 402; 29/602 R, 605

[56] References Cited

U.S. PATENT DOCUMENTS

| | | | |
|---|---|---|---|
| 3,431,144 | 3/1969 | Yawata et al. | 336/200 X |
| 3,483,499 | 12/1969 | Lugten | 336/200 X |
| 3,765,082 | 10/1973 | Zyetz | 336/200 |
| 3,798,059 | 3/1974 | Astle et al. | 336/200 X |
| 3,812,442 | 5/1974 | Muckelroy | 336/200 |
| 4,201,965 | 5/1980 | Onushkevych | 336/200 X |

OTHER PUBLICATIONS

Altmann et al., IBM Technical Disclosure Bulletin, Printed Delay Line, vol. 8, No. 5, Oct. 1965, pp. 741, 742.

*Primary Examiner*—Thomas J. Kozma
*Attorney, Agent, or Firm*—William J. Streeter; Bernard Franzblau

[57] ABSTRACT

A miniaturized electric coil having a low self-capacitance comprises a bottom conductor pattern provided on a substrate, an insulating intermediate layer and a top conductor pattern which is connected to the bottom conductor pattern via windows in the intermediate layer. The bottom and top conductor layers each comprise n single spiral-like paths. The inner end of the first spiral of the bottom conductor layer contacts the outer end of the first spiral of the top conductor layer, while the inner end of the first spiral of the top conductor layer in its turn contacts the outer end of the second spiral of the bottom conductor layer, and so on.

9 Claims, 4 Drawing Figures

FLAT ELECTRIC COIL

The invention relates to a miniaturized multi-layer flat electric coil comprising a stack formed of a number of conductor layers each having a system of spiral-like electrically conductive tracks, in which adjacent conductor layers are separated from each other by an electrically insulating layer and in which adjacent conductor layers are interconnected electrically via windows in the electrically insulating layer.

Flat electric coils having a number of conductor layers (so-called multi-layer coils) are disclosed in British Patent Specification No. 772,528. These known coils which may, for example, be manufactured by providing the material for the conductor layers in the form of pastes via a screen on separate electrically insulating substrates and stacking the substrates, have a first conductor layer with a multiple spiral which spirals from the outside to the inside and the inner end of which is connected to the inner end of a multiple spiral in the second conductor layer which spirals from the inside to the outside, and so on. An advantage of such a multilayer coil over likewise known mono-layer coils is that when an even number of conductor layers is used the end connections are present on the outside so that no bridging wire is necessary to produce a connection with the centre of the coil. An additional advantage is that the inductance per surface unit is considerably larger. The use of two conductor layers is interesting in particular because a coil having two conductor layers can be provided on a substrate in the same manner and during the same (silk screening) steps as other elements of a miniaturized circuit, for example, capacitors and crossing electric leads. A disadvantage of a two-layer coil having a design as described in the British Patent Specification, however, is that its self-capacitance is comparatively large.

It is an object of the invention to provide a flat electric coil having two conductor layers and a low self-capacitance.

For that purpose, a coil of the kind mentioned in the opening paragraph is characterized according to the invention in that it comprises a substrate which carries a stack of conductor layers, the first conductor layer having a number of conductor tracks each forming a single spiral having an inner end and an outer end, the $n^{th}$ spiral lying within the $n$-$1^{st}$ spiral. A second conductor layer if the coil also has a number of conductor tracks each forming a single spiral having an inner end and an outer end, the $n^{th}$ spiral also lying within the $n$-$1^{st}$ spiral. The single spirals of the first and second conductor layers are interconnected in a manner to form one multiple spiral having a uniform sense of rotation of which successive single spirals are situated alternately in the first and in the second conductor layer.

Due to this construction of self-capacitance of the coil is relatively large between a first pair of adjacent turns, comparatively small between a second pair of adjacent turns, comparatively large between a third pair of adjacent turns, and so on, so that the self-capacitance of the total coil can be kept comparatively small.

The invention further provides a miniaturized electric circuit having a planar substrate which carries at least a coil having turns spiraling once from the outside to the inside, a capacitor and/or a set of crossing conductor paths, the elements of the circuit being formed from a bottom conductor layer, a dielectric intermediate layer and a top conductor layer. In this case the design of the coil according to the invention makes it possible to provide the various discrete elements of the above circuit via the same thick-film steps (silk screening).

An èmbodiment of the miniaturized electric circuit in accordance with the invention is characterized in that a pattern for the coil having a number of single spiral-like paths each having an inner end and an outer end is formed from the bottom conductor layer, the $n^{th}$ path being situated within the $n$-$1^{st}$ path. A pattern for the coil also having a number of spiral-like paths each having an inner end and an outer end is formed from the top conductor layer, the $n^{th}$ path being situated within the $n$-$1^{st}$ path. Connections are made via windows in the dielectric intermediate layer so that the inner end of the first path of the bottom conductor layer is connected to the outer end of the first path of the top conductor layer, and the inner end of the first path of the top conductor layer in turn is connected to the outer end of the second path of the bottom conductor layer, and so on.

The invention will be described in greater detail, by way of example, with reference to the drawing, in which.

Two-layer coils according to the invention are manufactured by means of the same method as capacitors or crossing conductor paths. If crossing conductor paths and/or capacitors occur already on the substrate for the circuit to be made, this has the advantage that the coils can be made without extra thick-film process costs.

Figure 1:
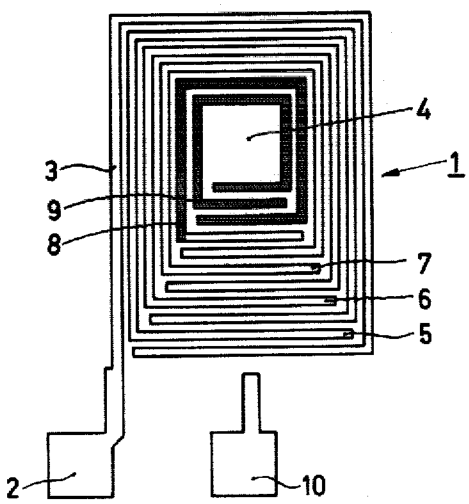
FIG. 1 is a plan view of a bottom conductor layer pattern for a coil according to the invention.

A conductor paste (for example, a paste made by Dupont having the indication Dupont 9770) is provided in a desired pattern on an electrically insulating substrate (which may be, for example, of aluminium oxide) by means of a first silk screen. With this print are formed, for example, lower conductor paths for crossing conductors, connection pads for resistors, bottom conductor pads for capacitors and bottom conductor layers for coils. FIG. 1 shows the pattern 1 for a bottom conductor layer for a two-layer coil according to the invention. The pattern 1 comprises a connection pad 2 which is connected to a first single spiral 3. Advancing towards the centre 4 of the coil to be made, there are placed successively a second spiral 5, a third spiral 6, a fourth spiral 7, a fifth spiral 8 and a sixth spiral 9. A second connection pad 10 is also present. The paste is dried and sintered at a temperature of approximately 850° C. After sintering, the thickness of the spirals is approximately 12 μm, their width is approximately 300 μm and their mutual distance is also approximately 300 μm.

Figure 2:
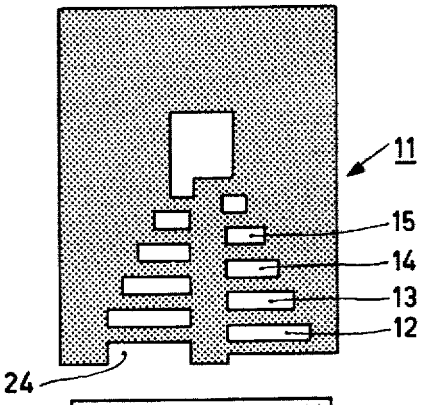
FIG. 2 is a plan view of an insulation layer pattern for a coil according to the invention.

A dielectric paste (for example, a paste made by Dupont having the indication Dupont 910) is provided over the conductive layer by means of a second silk screen. This print serves as an insulation layer for capacitors, crossing conductor paths and coils. FIG. 2 shows the pattern 11 for an insulation layer for a two-layer coil according to the invention. The pattern defines a number of windows 12, 13, 14, 15 and so on, through which the bottom conductor layer (FIG. 1) is electrically connected to a top conductor layer (FIG. 3) in a subsequent step. This paste is also dried and sintered at a temperature of 850° C. After sintering, the thickness of the insulation layer is approximately 40 μm. It is often to be preferred to provide the insulation layer in two steps so as to prevent the occurrence of continuous holes in the layer.

Figure 3:
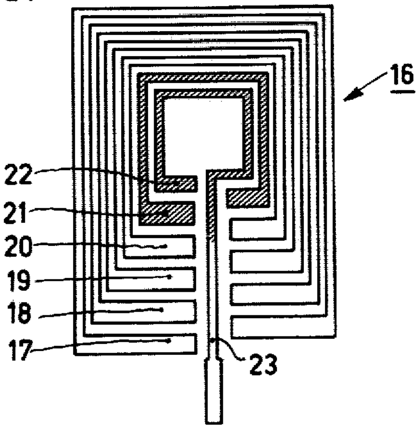
FIG. 3 is a plan view of a top conductor layer pattern for a coil according to the invention.

A second conductor paste (for example, again a paste made by Dupont having the indication Dupont 9770) is provided on the insulation layer by means of a third silk screen. With this print are formed top conductor surfaces for capacitors, upper conductor paths for crossing conductors and top conductor layers for coils. FIG. 3 shows the pattern 16 for a top conductor layer for the two-layer coil according to the invention. Proceeding from the outside to the inside, the pattern 16 comprises a first single spiral 17, a second spiral 18, a third spiral 19, a fourth spiral 20, a fifth spiral 21 and a sixth spiral 22. Spiral 22 is connected to a conductor path 23 which is led out. This paste is also dried and sintered at a temperature of approximately 850° C. As was the case with the bottom conductor layer, the thickness of the spirals after sintering is approximately 12 μm, their width is approximately 300 μm and their mutual distance is also approximately 300 μm.

By stacking the patterns shown in FIGS. 1, 2 and 3, the first spiral 3 of the bottom conductor layer is connected to the first spiral 17 of the top conductor layer via a window 24 in the insulation layer. The first spiral 17 of the top conductor layer is in its turn connected to the second spiral 5 of the bottom conductor layer via a window 12, and so on. Finally, the conductor path 23 of the top conductor layer is connected to the connection pad 10 of the bottom conductor layer.

Figure 4:
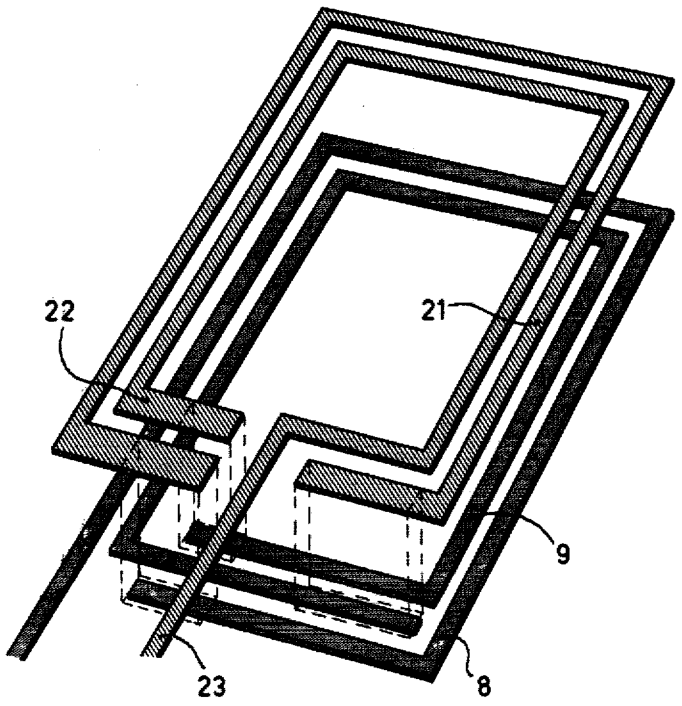
FIG. 4 is a perspective view of the central part of a coil in which the conductor layers of FIGS. 1 and 3 and the insulation layer of FIG. 2 have been used.

FIG. 4, in which the same reference numerals are used for the same components as in FIGS. 1, 2 and 3, shows for explanation a perspective view of the centre of a two-layer coil manufactured in the above-described manner in which the distance between the two conductor layers is greatly exaggerated.

A moisture-tight coating layer (for example an epoxy layer of ESL having the indication 240 SB) may be provided over the top conductor layer.

A two-layer coil manufactured in the above described manner and having an area of 84 mm$^2$ showed the following properties:

inductance: 0.94 μH self-resonance: 138 MHz
self-capacitance: 1.41 pH Q-factor at 49 MHz: 32

What is claimed is:

1. A miniaturized multi-layer flat electric coil comprising a substrate which carries a stack formed of a number of conductor layers, a first conductor layer having a number n of conductor tracks each forming a single spiral having an inner end and an outer end, the $n^{th}$ spiral being situated within the n-$1^{st}$ spiral, a second conductor layer having a number n of conductor tracks each forming a single spiral having an inner end and an outer end, the $n^{th}$ spiral being also situated within the n-$1^{st}$ spiral, and an electrically insulating layer having windows and interposed between the first and second conductor layers to separate said conductor layers from each other, said windows being located to provide electric interconnections between the adjacent first and second conductor layers such that the single spirals of the first and second conductor layers are interconnected to form one multiple spiral having a uniform sense of rotation in which successive single spirals are situated alternately in the first and in the second conductor layer.

2. An electric coil as claimed in claim 1, wherein the coil includes two electric connections, one of which is connected to the outer end of the outer spiral of the first conductor layer and the other one is connected to the inner end of the inner spiral of the second conductor layer.

3. An electric coil as claimed in claim 2, wherein the electric connection to the inner end of the inner spiral is formed by an electrically conductive track in the second conductor layer.

4. An electric coil as claimed in claim 3, characterized in that the electrically conductive track extends between the innermost end and the outermost end of the single spirals of the second conductor layer.

5. A miniaturized electric circuit comprising a planar substrate having a bottom conductor pattern provided on a planar surface of the substrate, a dielectric intermediate layer over the substrate and a top conductor pattern over the dielectric layer, an inductor comprising a helical continuous conductive path having individual spirals which, going from the outside to the inside, alternately lie in the bottom conductor pattern and in the top conductor pattern, and a capacitor element formed from a top and a bottom conductor pattern and an intermediate dielectric layer.

6. A miniaturized electric circuit comprising a planar substrate having a bottom conductor pattern provided on a planar surface of the substrate, a dielectric intermediate layer over the substrate and a top conductor pattern over the dielectric layer, an inductor comprising a helical continuous conductive path having individual spirals which, going from the outside to the inside, alternately lie in the bottom conductor pattern and in the top conductor pattern, and at least one pair of crossing conductors formed from a top and a bottom conductor pattern and an intermediate dielectric layer.

7. An electric circuit as claimed in claims 5 or 6 wherein the conductor patterns and the dielectric layer are provided by a thick-film technique.

8. An electric circuit as claimed in claims 5 or 6 wherein a pattern for the inductor having a number of single spiral-like paths each having an inner end and an outer end is formed from the bottom conductor pattern, in which the $n^{th}$ path is situated within the n-$1^{st}$ path, said pattern for the inductor further comprising a number of spiral-like paths each having an inner end and an outer end formed from the top conductor pattern, in which the $n^{th}$ path is situated within the n-$1^{st}$ path, and means including windows in the dielectric intermediate layer connecting the inner end of the first path of the bottom conductor pattern to the outer end of the first path of the top conductor pattern and the inner end of the first path of the top conductor pattern in its turn to the outer end of the second path of the bottom conductor pattern, and so on.

9. A miniature inductor comprising a substrate, a bottom conductor pattern provided on the substrate, an insulating intermediate layer over the bottom conductor pattern and provided with windows, a top conductor pattern over the insulating layer and electrically connected to the bottom conductor pattern via the windows in the intermediate layer, the bottom conductor pattern comprising a plurality n of single spiral-like paths each having an initial portion and an end portion, the $n^{th}$ spiral-like path being situated within the n-$1^{st}$ spiral-like path, the top conductor pattern also comprising a plurality n of single spiral-like paths each having an initial portion and an end portion, the $n^{th}$ spiral-like path being situated within the $n-1^{st}$ spiral-like path, and wherein the single spirals of the top and bottom conductor patterns are connected such that one continuous helical path is formed, successive single spirals of which are situated alternately in the bottom and in the top conductor patterns.

* * * * *